United States Patent
Tseng et al.

(10) Patent No.: US 8,859,912 B2
(45) Date of Patent: Oct. 14, 2014

(54) CORELESS PACKAGE SUBSTRATE AND FABRICATION METHOD THEREOF

(75) Inventors: Tzyy-Jang Tseng, Taoyuan (TW); Chung-W. Ho, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 193 days.

(21) Appl. No.: 13/281,499

(22) Filed: Oct. 26, 2011

(65) Prior Publication Data
US 2013/0008705 A1 Jan. 10, 2013

(30) Foreign Application Priority Data
Jul. 8, 2011 (TW) .............................. 100124351 A

(51) Int. Cl.
*H05K 1/11* (2006.01)
(52) U.S. Cl.
CPC ...................................... *H05K 1/111* (2013.01)
USPC .............................................. 174/262; 29/846
(58) Field of Classification Search
CPC .......................................... H05K 1/111–1/116
USPC ...................... 174/260, 262–266; 29/846–853
See application file for complete search history.

(56) References Cited

U.S. PATENT DOCUMENTS

| 8,188,380 B2* | 5/2012 | Kawai et al. ................... 174/262 |
| 8,357,860 B2* | 1/2013 | Kaneko .......................... 174/262 |
| 2005/0252682 A1* | 11/2005 | Shimoto et al. ............... 174/260 |

* cited by examiner

*Primary Examiner* — Jeremy C Norris
(74) *Attorney, Agent, or Firm* — Edwards Wildman Palmer LLP; Peter F. Corless; Steven M. Jensen

(57) ABSTRACT

A coreless package substrate is provided, including: a circuit buildup structure including at least a dielectric layer, at least a circuit layer and conductive elements; first electrical contact pads embedded in the lowermost dielectric layer of the circuit buildup structure; a plurality of metal bumps formed on the uppermost circuit layer of the circuit buildup structure; a dielectric passivation layer disposed on a top surface of the circuit buildup structure and the metal bumps; and second electrical contact pads embedded in the dielectric passivation layer and electrically connected to the metal bumps. With the second electrical contact pads being engaged with the metal bumps and having top surfaces thereof completely exposed, the bonding strength between the second electrical contact pads and a chip to be mounted thereon and between the second electrical contact pads and the metal bumps can be enhanced.

16 Claims, 6 Drawing Sheets

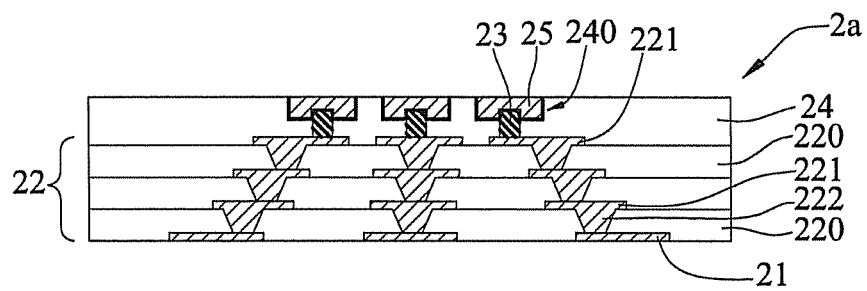
FIG. 3
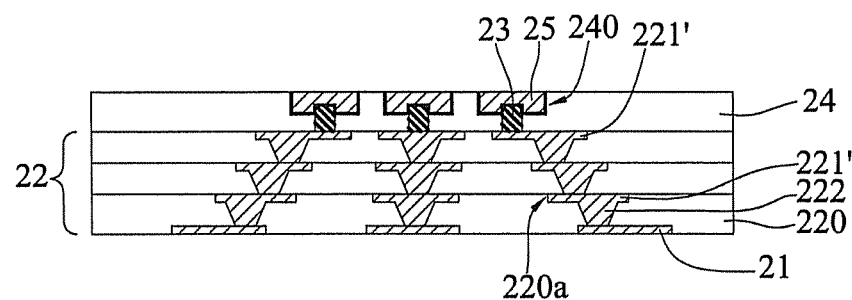
FIG. 3'
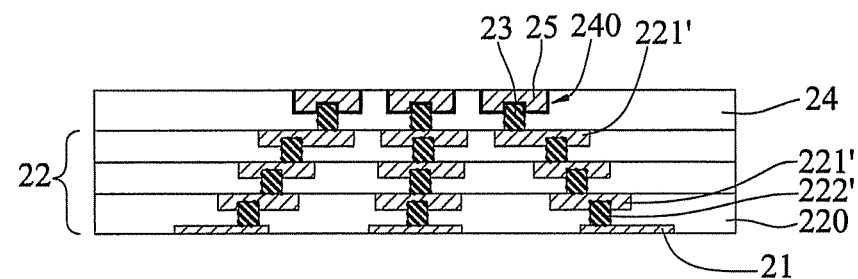
FIG. 3"

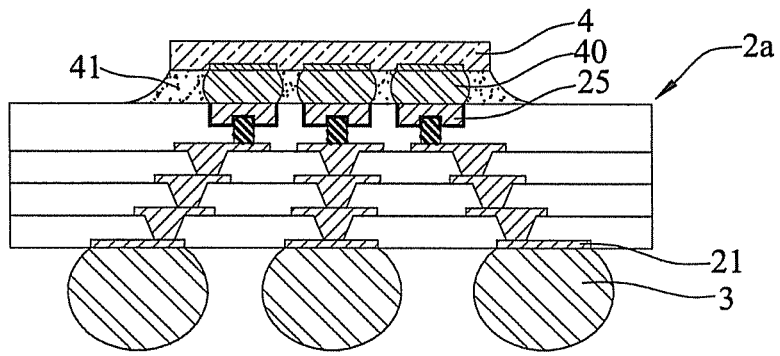
FIG. 4
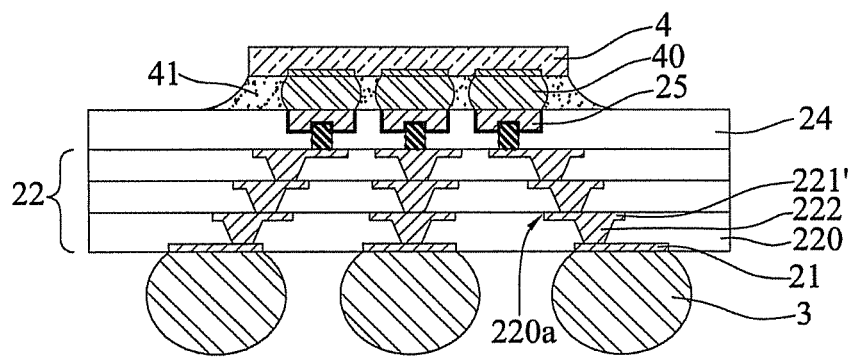
FIG. 4'
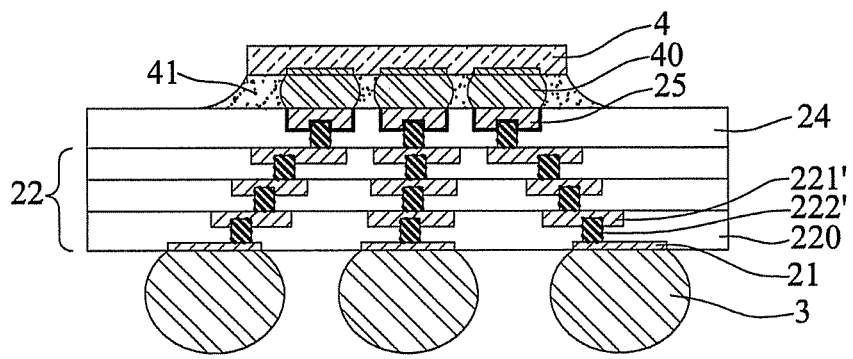
FIG. 4"

CORELESS PACKAGE SUBSTRATE AND FABRICATION METHOD THEREOF

CROSS-REFERENCES TO RELATED APPLICATIONS

This application claims under 35 U.S.C. §119(a) the benefit of Taiwanese Application No. 100124351, filed Jul. 8, 2011, the entire contents of which is incorporated herein by reference.

BACKGROUND OF THE INVENTION

1. Field of the Invention

The present invention relates to package substrates, and more particularly, to a coreless package substrate and a fabrication method of the coreless package substrate.

2. Description of Related Art

Electronic devices are made having more functions and higher performance in response to the development of electronic industry. For semiconductor package structures, various types of packages such as a wire-bonded package and a flip-chip package have been developed. With a semiconductor chip being mounted on a package substrate, the wire-bonded package uses bonding wires for electrically connecting the semiconductor chip to the package substrate, whereas in the flip-chip package, the semiconductor chip is electrically connected to the package substrate by solder bumps. Further, considering the high integration and miniaturization requirements for the semiconductor package to accommodate more active and passive components and circuits, the package substrate has been evolved from a double-layer board to a multi-layer board. The multi-layer board involves the use of interlayer connection technique within a limited space in order to provide an increased circuit layout area on the package substrate. This arrangement is suitably used for integrated circuits having high circuit density, reduces thickness of the package substrate, and also reduces the package profile and enhances the electrical performance thereof.

Conventionally the package substrate comprises a core board having inner circuits, and circuit buildup structures symmetrically disposed on two sides of the core board. However, the presence of the core board makes overall thickness of the package substrate hard to be reduced, thereby not in favor of profile miniaturization for the electronic devices.

Accordingly, a coreless package substrate has been developed, which shortens circuit length and decreases overall structure thickness, as required for highly integrated and miniaturized electronic devices. As shown in FIG. 1, the coreless package substrate 1 can be fabricated by the steps of: forming a first dielectric layer 10 on a carrier board (not shown), and forming a first circuit layer 11 on the first dielectric layer 10, the first circuit layer 11 having a plurality of first electrical contact pads 110; forming a circuit buildup structure 12 on the first dielectric layer 10 and the first circuit layer 11, wherein the circuit buildup structure 12 comprises at least a second dielectric layer 120 and a second circuit layer 121 formed on the second dielectric layer 120, wherein the second circuit layer 121 comprises a plurality of second electrical contact pads 123 and is electrically connected to the first circuit layer 11 by conductive vias 122; removing the carrier board to expose the first dielectric layer 10; applying solder mask layers 14a, 14b (such as solder resist) respectively on the first dielectric layer 10 and the second dielectric layer 120 and second circuit layer 121; forming a plurality of openings 140a, 140b through the solder mask layers 14a, 14b and the first dielectric layer 10 to respectively expose partial top surfaces of the first and second electrical contact pads 110, 123; forming metal bumps 13a, 13b respectively in the openings 140a, 140b and mounting solder balls 15a, 15b to the metal bumps 13a, 13b respectively, so as to allow the upper solder balls 15b to bond solder bumps of a chip (not shown) and allow the lower solder balls 15a to mount a circuit board (not shown) thereto.

However in the conventional package substrate 1, as it is required to form the openings 140a, 140b through the solder mask layers 14a, 14b and perform positional alignment between the solder balls 15a, 15b and the openings 140a, 140b, the fabrication method thereof becomes complicated and difficult.

Moreover, only partial top surfaces of the second electrical contact pads 123, instead of the entire top surfaces thereof, are exposed from the openings 140b of the solder mask layer 14b, such that the metal bumps 13b bonded to the exposed partial top surfaces of the second electrical contact pads 123 have relatively small top surfaces for subsequently mounting a chip thereto, thereby making the bonding strength between the metal bumps 13b and the chip relatively weak and allowing the chip to be easily detached and damaged.

Furthermore, in order to avoid short circuiting between the adjacent upper solder balls 15b and to provide sufficient sizes of the openings 140b of the solder mask layer 14b for allowing the metal bumps 13b to be securely bonded to the solder balls 15b, the adjacent second electrical contact pads 123 must have a sufficient pitch distance therebetween and cannot be further closely arranged, such that the layout density of the second electrical contact pads 123 is hardly increased.

Therefore, how to overcome the above drawbacks of the conventional technology is becoming one of the most popular issues in the art.

SUMMARY OF THE INVENTION

In view of the drawbacks of the prior art mentioned above, it is therefore an objective of the present invention to provide a fabrication method of a coreless package substrate, comprising the steps of: providing a carrier board having two opposing surfaces, and forming a plurality of first electrical contact pads on the two opposing surfaces of the carrier board; forming circuit buildup structures on the carrier board and the first electrical contact pads, wherein each of the circuit buildup structures comprises: at least a dielectric layer, at least a circuit layer provided respectively on the at least a dielectric layer, and a plurality of conductive elements formed in the at least a dielectric layer and electrically connected to the at least a circuit layer, wherein the first electrical contact pads are embedded in a lowermost one of the at least a dielectric layer and electrically connected to the conductive elements formed in the lowermost dielectric layer; forming a plurality of metal bumps on an uppermost one of the at least a circuit layer of each of the circuit buildup structures; applying a dielectric passivation layer on an uppermost one of the at least a dielectric layer and the uppermost circuit layer of each of the circuit buildup structures, wherein the metal bumps are covered by the dielectric passivation layer; forming a plurality of recesses in the dielectric passivation layer to expose the metal bumps respectively, wherein the metal bumps are protruded from bottoms of the recesses; forming second electrical contact pads in the recesses, wherein the second electrical contact pads are engaged with and electrically connected to the metal bumps, for being electrically coupled to a semiconductor chip; and removing the carrier board, and allowing the first electrical contact pads to be exposed from a surface of the lowermost dielectric layer.

According to the above fabrication method, by forming the second electrical contact pads in the recesses, top surfaces of the second electrical contact pads can be entirely exposed from the dielectric passivation layer, such that no positional alignment between the openings and the solder balls as in the conventional technology is required in the present invention when subsequently mounting a semiconductor chip, and the semiconductor chip can be directly bonded to the second electrical contact pads, thereby significantly simplifying the fabrication processes.

Moreover, as the second electrical contact pads are engaged with the metal bumps and have the top surfaces thereof entirely exposed form the dielectric passivation layer, a bonding area between the second electrical contact pads and the semiconductor chip can be increased, thereby enhancing the bonding strength between second electrical contact pads and the semiconductor chip and between the second electrical contact pads and the metal bumps, with no concern of the semiconductor chip becoming detached and damaged.

Further, the second electrical contact pads in the recesses can have a reduced area if necessary in fabrication, such that a pitch distance between the adjacent metal bumps can be reduced as long as the adjacent second electrical contact pads are not in contact with each other. Thereby, the metal bumps and the second electrical contact pads can be closely arranged with a small pitch distance respectively, and the layout density of the second electrical contact pads is desirably increased.

In addition, by the above fabrication method of a coreless package substrate, the present invention also provides the coreless package substrate and more detailed disclosure of the fabrication method, as later described.

BRIEF DESCRIPTION OF DRAWINGS

The present invention can be more fully understood by reading the following detailed description of the preferred embodiments, with reference made to the accompanying drawings, wherein:

FIGS. 3, 3' and 3" are cross-sectional views illustrating a coreless package substrate of different embodiments according to the present invention; and FIGS. 4, 4' and 4" are cross-sectional views illustrating subsequent application of a coreless package substrate of different embodiments according to the present invention.

DETAILED DESCRIPTION OF PREFERRED EMBODIMENTS

The following illustrative embodiments are provided to illustrate the disclosure of the present invention; those in the art can apparently understand these and other advantages and effects after reading the disclosure of this specification. The present invention can also be performed or applied by other different embodiments. Some terms such as "on", "upper", "lower" and "a" used in the specification are only for easy illustration but not for limiting the scope of the present invention. The details of the specification may be on the basis of different points and applications, and numerous modifications and variations can be devised without departing from the spirit of the present invention.

Please refer to FIGS. 2A through 2G, which are cross-sectional views illustrating a method of fabricating a coreless package substrate according to the present invention.

Figure 2A:
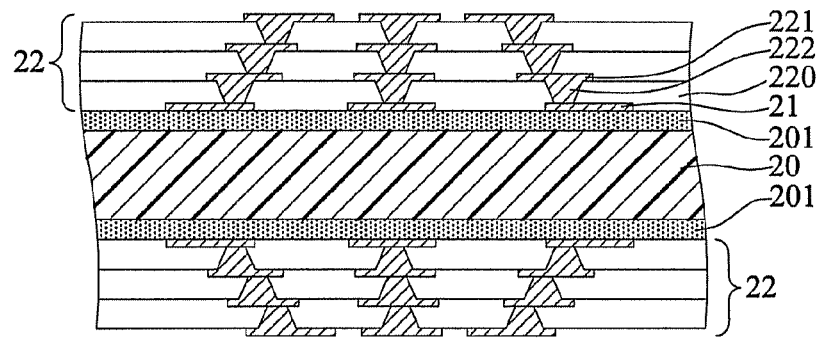
FIGS. 2A through 2G are cross-sectional views illustrating a method of fabricating a coreless package substrate according to the present invention, wherein FIG. 2G' is another embodiment of FIG. 2G.

As shown in FIG. 2A, first, a carrier board 20 having two opposing surfaces is provided. A plurality of first electrical contact pads 21 are formed on the two surfaces of the carrier board 20.

Then, circuit buildup structures 22 are respectively formed on the two surfaces of the carrier board 20 and the plurality of first electrical contact pads 21. Each of the circuit buildup structures 22 comprises at least a dielectric layer 220, at least a circuit layer 221 disposed respectively on the dielectric layers 220, and a plurality of conductive elements (such as conductive vias 222 in this embodiment) formed in the dielectric layers 220 and electrically connected to the circuit layers 221. The first electrical contact pads 21 are embedded in the lowermost dielectric layer 220 (or the dielectric layer 220 closest to the carrier board 20) and are electrically connected to the conductive vias 222 provided in the lowermost dielectric layer 220.

In this embodiment, a peeling layer 201 is disposed on each of the two opposing surfaces of the carrier board 20 in a manner that the plurality of first electrical contact pads 21 and the lowermost dielectric layer 220 of each of the circuit buildup structures 22 are attached to the corresponding peeling layer 201. Moreover, a copper layer can be formed on a side of the peeling layer 201 (opposite to the side thereof attached to the carrier board 20) and used to form the first electrical contact pads 21 by electroplating.

Figure 2B:
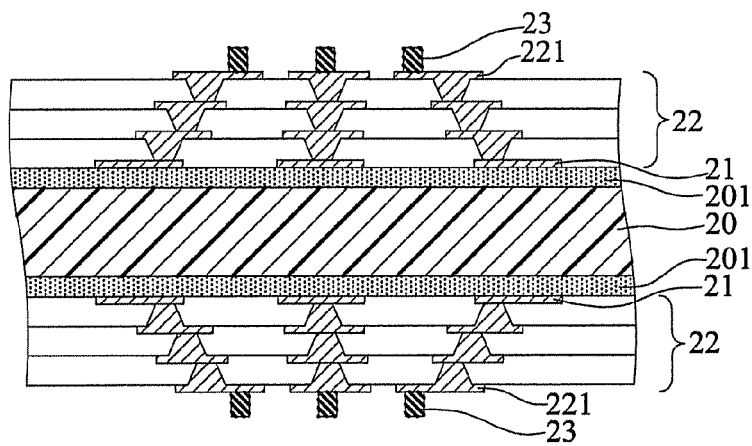

As shown in FIG. 2B, each of the circuit buildup structures 22 is subjected to a patterning process to form a plurality of metal bumps 23 on the uppermost circuit layer 221 (or the circuit layer 221 furthest from the carrier board 20).

The metal bumps 23 can be made of copper, nickel, tin, gold, silver or copper-tin alloy. The patterning process can include an additive process, a semi-additive process (SAP), a subtractive process, an electroplating process, an electroless plating deposit process, a chemical deposit process or a printing process so as to form the meal bumps 23. It should be understood that there are numerous methods and materials suitable for forming the metal bumps, but not limited to those described above.

Figure 2C:
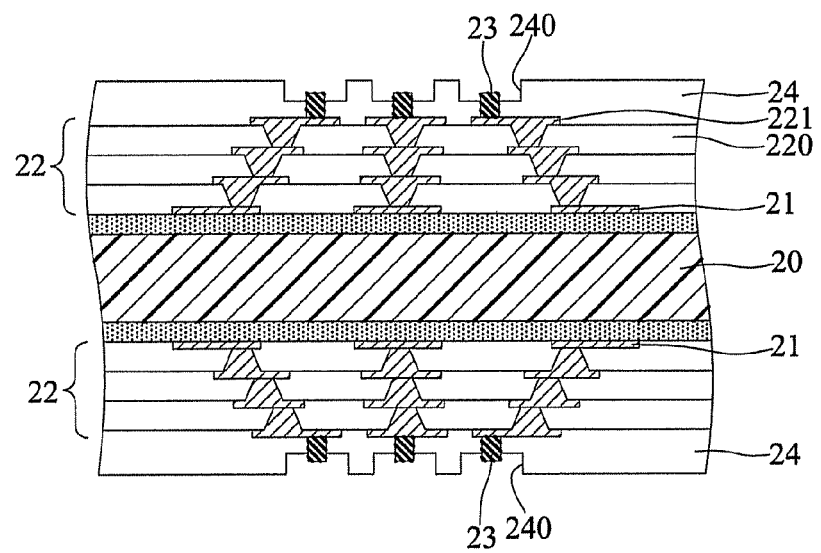

As shown in FIG. 2C, a dielectric passivation layer 24 is applied on the uppermost dielectric layer 220 (or the dielectric layer 220 furthest from the carrier board 20) and the uppermost circuit layer 221 of each of the circuit buildup structures 22, and covers the metal bumps 23. Then, the dielectric passivation layer 24 is subjected to laser burning or plasma etching to form a plurality of recesses 240 that correspondingly expose the metal bumps 23, wherein the metal bumps 23 are protruded from bottoms of the recesses 240.

In another embodiment, a polymer film (not shown), made of a liquid or solid polymer material, can be first applied on the respective dielectric passivation layer 24. Then, laser burning is performed through the polymer film and the dielectric passivation layer 24 to form the recesses 240, and surface polar strength of the recesses 240 can be enhanced by plasma. Subsequently, an activation layer (not shown) is formed on walls of the recesses 240 by immersion/dip plating. Specifically, the dielectric passivation layer 24 is immersed in a chemical solution containing metal particles, allowing the metal particles to be attached to the walls of the recesses 240 to form the activation layer, and then the activation layer is subjected to acceleration. Finally, the polymer film is removed by peeling, polishing or chemical etching, allowing the metal particles on the walls of the recesses 240 to be retained. The activation layer can be made of palladium, platinum, gold or silver, wherein the palladium material can come from tin palladium chloride colloid or palladous sulfate chelator.

Figure 2D:
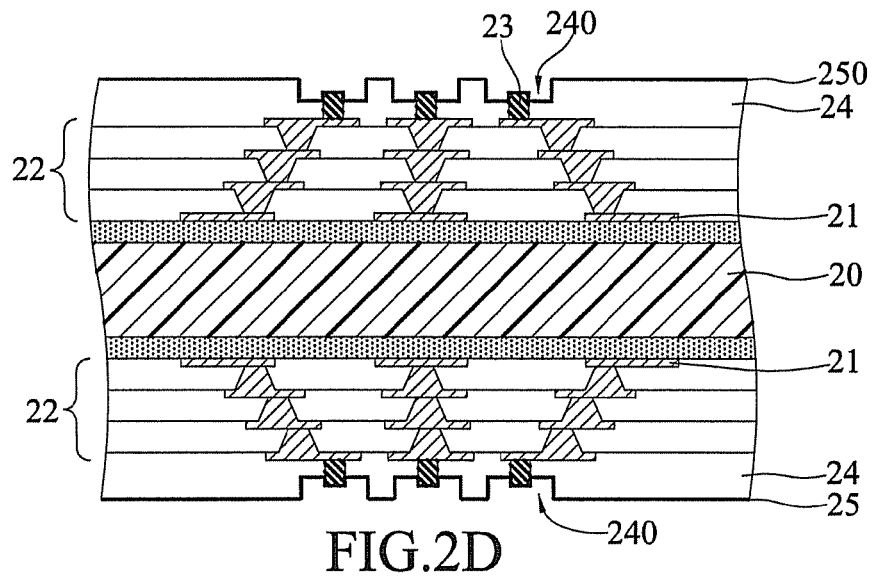

As shown in FIG. 2D, a conductive layer 250 is formed on the dielectric passivation layer 24, the metal bumps 23 and the recesses 240 (or the activation layer) for each of the circuit buildup structures 22. The conductive layer 250 primarily serves as a current conducting path used for subsequent plating of metal materials. The conductive layer 250 can be made by plating copper, metal or alloy or depositing several metal layers, or made of a conductive polymer material.

Figure 2E:
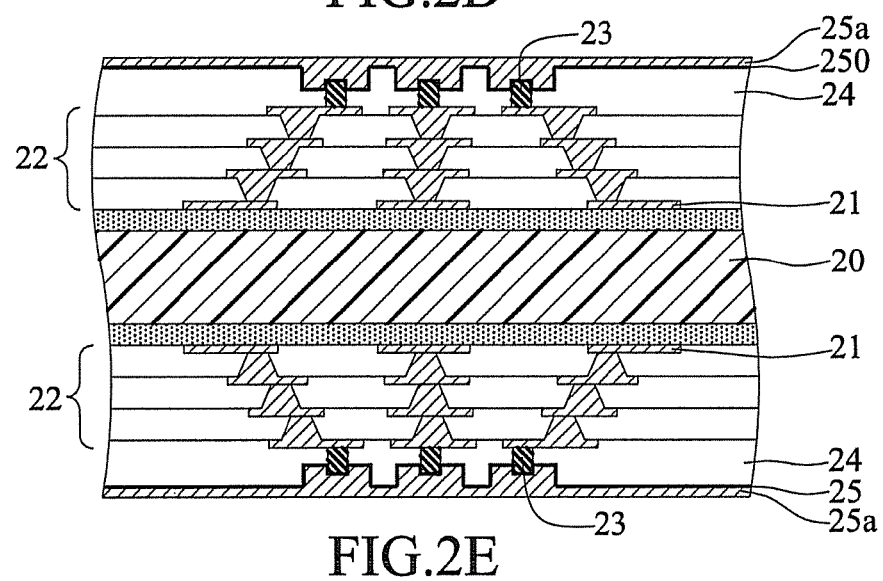

As shown in FIG. 2E, a metal material layer 25a is plated on the conductive layer 250, and can be made of (but not limited to) copper.

Figure 2F:
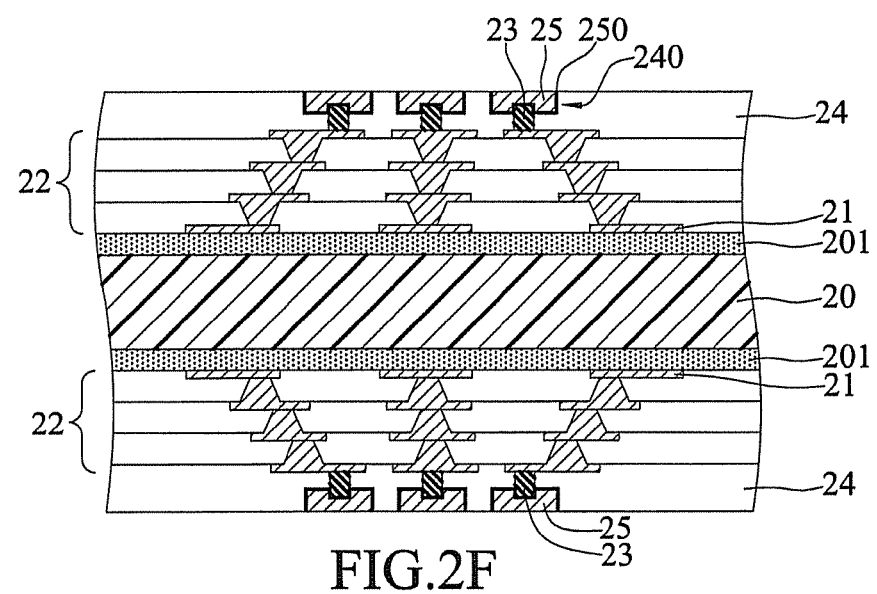

As shown in FIG. 2F, the metal material layer 25a and the conductive layer 250 on the dielectric passivation layer 24 are removed by a planarizing process (such as brush polishing, mechanical polishing or chemical mechanical polishing), allowing the metal material layer 25a and the conductive layer 250 in the recesses 240 to be retained to form second electrical contact pads 25 in the recesses 240. The second electrical contact pads 25 are engaged with the metal bumps 23 (or the metal bumps 23 are partially embedded in the second electrical contact pads 25). The second electrical contact pads 25 are electrically connected to the metal bumps 23. The second electrical contact pads 25 are coplanar with the dielectric passivation layer 24.

Figure 2G:
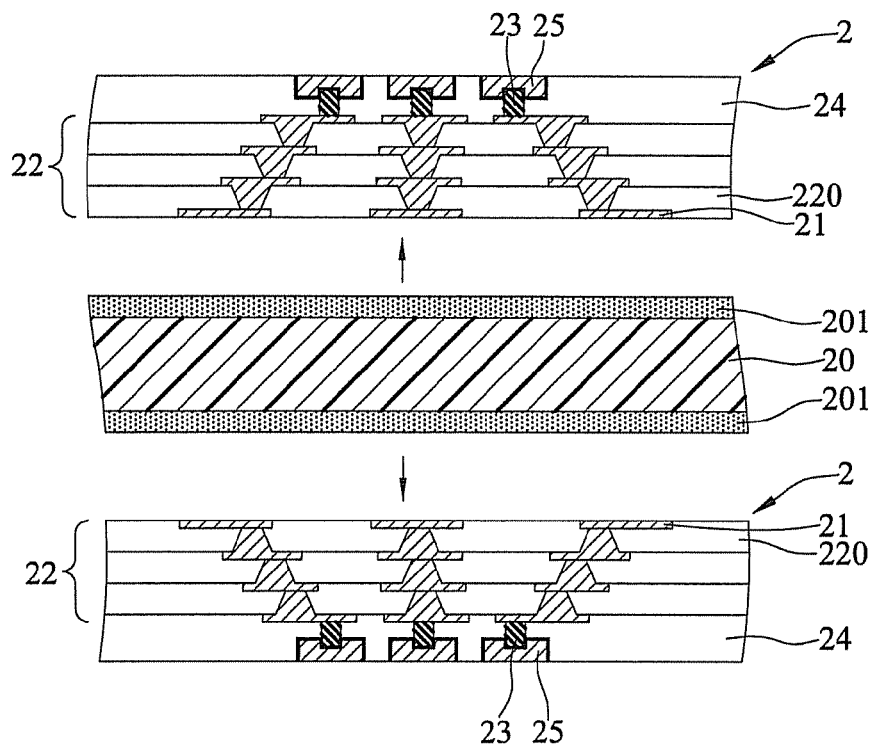
Figure 2G:
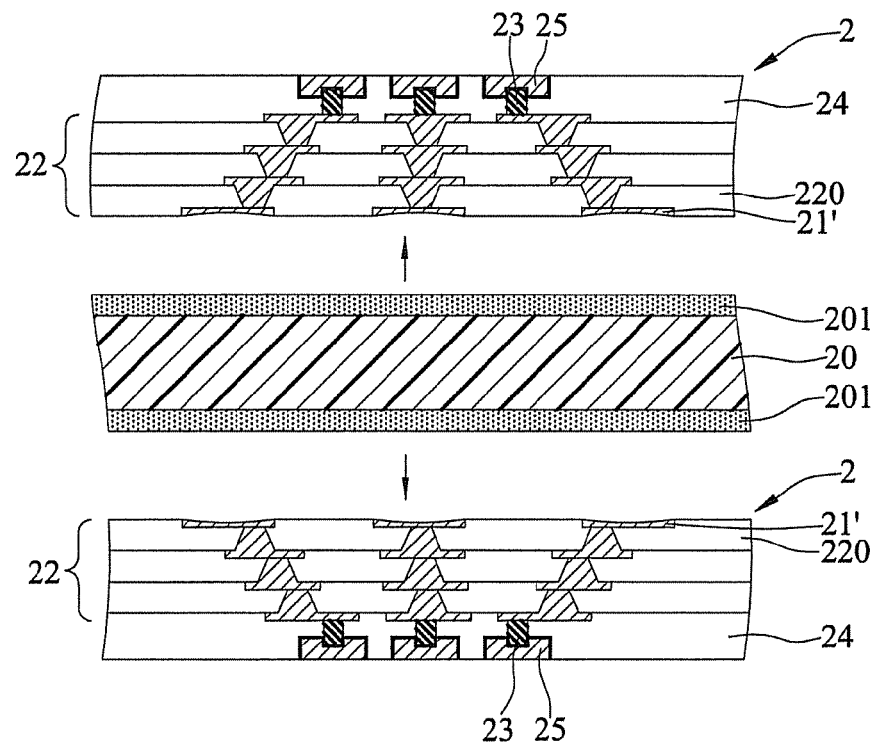

As shown in FIG. 2G, the peeling layer 201 is detached from each of the circuit buildup structures 22, such that the carrier board 20 can be removed, and the first electrical contact pads 21 are exposed from the lowermost dielectric layer 220 in each of the circuit buildup structures 22. Thereby, the coreless package substrates 2 according to the present invention are fabricated.

As shown in FIG. 2G', if the peeling layer 201 has a copper layer thereon, after removing the carrier board 20, the copper layer should be removed by etching, such that the first electrical contact pads 21 exposed from the lowermost dielectric layer 220 become slightly recessed.

As shown in FIGS. 3 and 4, a singulation process is performed to provide a single package substrate 2a. A semiconductor chip 4 can be mounted in a flip-chip manner to the second electrical contact pads 25 of the package substrate 2a by solder bumps 40. An underfill layer 41 is applied between the semiconductor chip 4 and the dielectric passivation layer 24 of the package substrate 2a to enclose the solder bumps 40. Conductive elements such as solder balls 3 or pins (not shown) can be bonded to exposed surfaces of the first electrical contact pads 21 of the package substrate 2a, so as to allow the conductive elements to be mounted to an electronic device (not shown).

Figure 1:
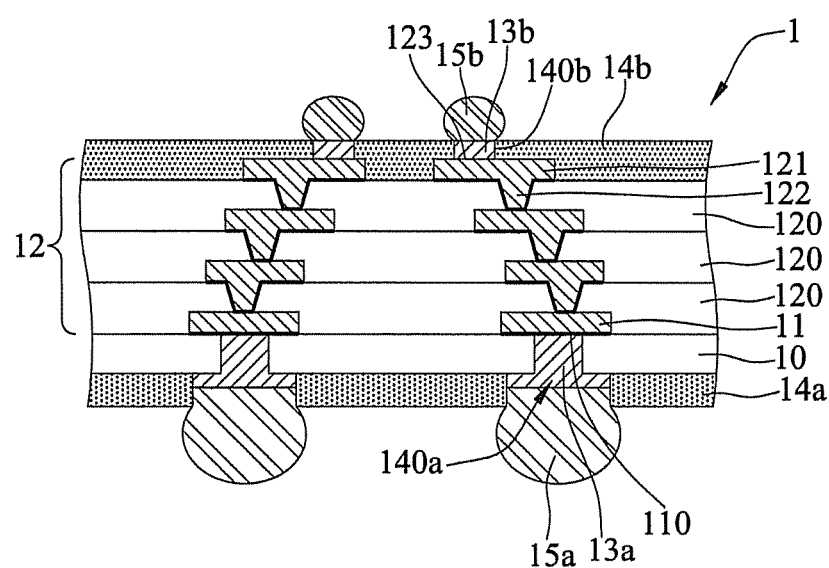
FIG. 1 (PRIOR ART) is a cross-sectional view illustrating a coreless package substrate according to the prior art.

In the fabrication method according to the present invention, the planarizing process is performed such that top surfaces of the second electrical contact pads 25 are entirely exposed from the dielectric passivation layer 24, without having to form openings through the solder mask layer as in the conventional technology. Thereby, no positional alignment for the openings as in the conventional technology is required in the present invention when subsequently mounting the semiconductor chip 4, and the solder bumps 40 of the semiconductor chip 4 can be directly bonded to the second electrical contact pads 25, without having to form solder balls 15b (as shown in FIG. 1) on the metal bumps 23. This significantly simplifies the fabrication processes.

Moreover, as the second electrical contact pads 25 are engaged with the metal bumps 23 and have the top surfaces thereof entirely exposed form the dielectric passivation layer 24, bonding areas between the second electrical contact pads 25 and the solder bumps 40 can be increased, thereby enhancing the bonding strength between second electrical contact pads 25 and the solder bumps 40 and between second electrical contact pads 25 and the metal bumps 23. Advantageously, the semiconductor chip 4 can be firmly mounted on the package substrate 2a, with no concern of becoming detached and damaged.

Further as the top surfaces of the second electrical contact pads 25 are entirely exposed form the dielectric passivation layer 24, a pitch distance between the adjacent metal bumps 23 can be reduced as long as the adjacent second electrical contact pads 25 are not in contact with each other. Thereby, the metal bumps 23 and the second electrical contact pads 25 can be closely arranged with a small pitch distance respectively, and the layout density of the second electrical contact pads 25 is desirably increased.

FIGS. 3', 3", 4' and 4" show other embodiments of fabricating the coreless package substrate with respect to FIG. 2A. As shown in FIG. 3', during the fabrication of the circuit buildup structure 22, circuit recesses 220a can be formed in the dielectric layers 220 such that circuit layers 221' are provided in the circuit recesses 220a. Together with the provision of the conductive vias 222, embedded circuit layers 221' are fabricated. Alternatively, as shown in FIG. 3", the conductive elements are conductive posts 222' for electrically connecting the circuit layers 221' to the first electrical contact pads 21, wherein the circuit layers 221' and the conductive posts 222' are separately fabricated. Moreover, the circuit recesses 220a can be formed by various techniques such as, but not limited to, the above mentioned activation layer technique.

The present invention also provides a coreless package substrate 2a, comprising: a circuit buildup structure 22; a plurality of first electrical contact pads 21 formed on a side of the circuit buildup structure 22; a plurality of metal bumps 23 formed on an opposing side of the circuit buildup structure 22; a dielectric passivation layer 24 applied over the opposing side of the circuit buildup structure 22 and the metal bumps 23; and a plurality of second electrical contact pads 25 embedded in the dielectric passivation layer 24.

The circuit buildup structure 22 comprises: at least a dielectric layer 220, at least a circuit layer 221 disposed respectively on the dielectric layers 220, and a plurality of conductive vias 222 formed in the dielectric layers 220 and electrically connected to the circuit layers 221. In one embodiment, the circuit layers 221' can be embedded in the dielectric layers 220, as shown in FIG. 3'. In another embodiment, the conductive vias 222 are replaced by the conductive posts 222' for electrically interconnecting the circuit layers 221', as shown in FIG. 3".

The first electrical contact pads 21 are embedded in the lowermost dielectric layer 220 and are electrically connected to part of the conductive vias 222 or conductive posts 222'. The first electrical contact pads 21 are also exposed from the surface of the lowermost dielectric layer 220. Particularly, the first electrical contact pads 21 can be coplanar with the surface of the lowermost dielectric layer 220, or the first electrical contact pads 21' can be slightly recessed from the surface of the lowermost dielectric layer 220.

The metal bumps 23 are disposed on the uppermost circuit layer 221.

The dielectric passivation layer 24 is applied on the uppermost dielectric layer 220, the uppermost circuit layer 221 and the metal bumps 23, and has a plurality of recesses 240 from which the metal bumps 23 are exposed in a manner that the metal bumps 23 are protruded from the bottom of the recesses 240.

The second electrical contact pads 25 are formed in the recesses 240 and engaged with the metal bumps 23 respectively, and can be coplanar with the dielectric passivation layer 24. The second electrical contact pads 25 are electrically connected to the metal bumps 23, and can be electrically coupled to the semiconductor chip 4.

The package substrate 2a further comprises a conductive layer 250 provided between the second electrical contact pads 25 and the metal bumps 23 and between the second electrical contact pads 25 and the dielectric passivation layer 24.

Therefore, in the coreless package substrate and the fabrication method thereof according to the present invention, the dielectric passivation layer is used instead of the conventional solder mask layer, such that top surfaces of the second electrical contact pads can be entirely exposed from the dielectric passivation layer, without having to form openings in the dielectric passivation layer. This desirably simplifies the fabrication processes when subsequently mounting a semiconductor chip to the package substrate.

Moreover, as the second electrical contact pads are engaged with the metal bumps and have the top surfaces thereof entirely exposed from dielectric passivation layer, the bonding strength between the second electrical contact pads and the semiconductor chip mounted thereto can be enhanced, thereby avoiding detachment and damage of the semiconductor chip.

Further as the top surfaces of the second electrical contact pads are entirely exposed from dielectric passivation layer, the metal bumps and the second electrical contact pads can be closely arranged with a small pitch distance respectively, such that the layout density of the second electrical contact pads is desirably increased.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A coreless package substrate, comprising:
   a circuit buildup structure comprising at least a dielectric layer, at least a circuit layer provided respectively on the at least a dielectric layer, and a plurality of conductive elements formed in the at least a dielectric layer and electrically connected to the at least a circuit layer;
   a plurality of first electrical contact pads embedded in a lowermost one of the at least a dielectric layer and electrically connected to part of the conductive elements, wherein the first electrical contact pads are exposed from a surface of the lowermost dielectric layer;
   a plurality of metal bumps formed on an uppermost one of the at least a circuit layer;
   a dielectric passivation layer applied on an uppermost one of the at least a dielectric layer, the uppermost circuit layer and the metal bumps, and having a plurality of recesses from which the metal bumps are exposed, wherein the metal bumps are protruded from bottoms of the recesses; and
   second electrical contact pads formed in the recesses, engaged with the metal bumps, and being in contact with a top surface and a part of side surfaces of the metal bumps, wherein the second electrical contact pads are electrically connected to the metal bumps, for being electrically coupled to a semiconductor chip.

2. The coreless package substrate of claim 1, wherein the at least a circuit layer is embedded in the at least a dielectric layer respectively.

3. The coreless package substrate of claim 1, wherein the conductive elements are conductive vias or conductive posts.

4. The coreless package substrate of claim 1, wherein the first electrical contact pads are coplanar with the lowermost dielectric layer or are recessed from the surface of the lowermost dielectric layer.

5. The coreless package substrate of claim 1, wherein the second electrical contact pads are coplanar with the dielectric passivation layer.

6. The coreless package substrate of claim 1, further comprising a conductive layer formed between the second electrical contact pads and the metal bumps and between the second electrical contact pads and the dielectric passivation layer.

7. A fabrication method of a coreless package substrate, comprising the steps of:
   providing a carrier board having two opposing surfaces, and forming a plurality of first electrical contact pads on the two opposing surfaces of the carrier board;
   forming circuit buildup structures on the carrier board and the first electrical contact pads, wherein each of the circuit buildup structures comprises: at least a dielectric layer, at least a circuit layer provided respectively on the at least a dielectric layer, and a plurality of conductive elements formed in the at least a dielectric layer and electrically connected to the at least a circuit layer, wherein the first electrical contact pads are embedded in a lowermost one of the at least a dielectric layer and electrically connected to part of the conductive elements;
   forming a plurality of metal bumps on an uppermost one of the at least a circuit layer of each of the circuit buildup structures;
   applying a dielectric passivation layer on an uppermost one of the at least a dielectric layer and the uppermost circuit layer of each of the circuit buildup structures, wherein the metal bumps are covered by the dielectric passivation layer;
   forming a plurality of recesses in the dielectric passivation layer to expose the metal bumps respectively, wherein the metal bumps are protruded from bottoms of the recesses;
   forming second electrical contact pads in the recesses, wherein the second electrical contact pads are engaged with the metal bumps, in contact with a top surface and a part of side surfaces of the metal bumps, and electrically connected to the metal bumps, for being electrically coupled to a semiconductor chip; and
   removing the carrier board, and allowing the first electrical contact pads to be exposed from a surface of the lowermost dielectric layer.

8. The fabrication method of a coreless package substrate of claim 7, wherein a peeling layer is provided on each of the two opposing surfaces of the carrier board, allowing the first electrical contact pads and the lowermost dielectric layer to be attached to the peeling layer, and allowing the carrier board to be removed by detaching the peeling layer from each of the circuit buildup structures.

9. The fabrication method of a coreless package substrate of claim 7, wherein the at least a dielectric layer is formed with circuit recesses, and the at least a circuit layer is provided in the circuit recesses.

10. The fabrication method of a coreless package substrate of claim 7, wherein the conductive elements are conductive vias or conductive posts.

11. The fabrication method of a coreless package substrate of claim 7, wherein the metal bumps are made of copper, nickel, tin, gold, silver or copper-tin alloy.

12. The fabrication method of a coreless package substrate of claim 7, wherein the metal bumps are fabricated by an additive process, a semi-additive process, a subtractive process, an electroplating process, an electroless deposit process, a chemical deposit process or a printing process.

13. The fabrication method of a coreless package substrate of claim 7, wherein the recesses are formed by laser burning or plasma etching.

14. The fabrication method of a coreless package substrate of claim 7, wherein the second electrical contact pads are coplanar with the dielectric passivation layer.

15. The fabrication method of a coreless package substrate of claim 7, wherein the second electrical contact pads are fabricated by the steps of:

forming a conductive layer on the dielectric passivation layer and the recesses;

forming a metal material layer on the conductive layer; and removing the metal material layer and the conductive layer on the dielectric passivation layer, and allowing the metal material layer and the conductive layer in the recesses to be retained and become the second electrical contact pads.

16. The fabrication method of a coreless package substrate of claim 15, wherein the metal material layer and the conductive layer on the dielectric passivation layer are removed by a brush polishing process, a mechanical polishing process or a chemical mechanical polishing process.

\* \* \* \* \*